June 25, 1957 R. R. YOST, JR 2,797,267

TRANSISTOR AMPLIFIER WITH NEUTRALIZED INTERNAL FEEDBACK

Filed Jan. 18, 1954

INVENTOR.
Russell R. Yost Jr.
BY Mueller & Aichele
Attys.

United States Patent Office 2,797,267

Patented June 25, 1957

2,797,267

TRANSISTOR AMPLIFIER WITH NEUTRALIZED INTERNAL FEEDBACK

Russell R. Yost, Jr., Phoenix, Ariz., assignor to Motorola, Inc., Chicago, Ill., a corporation of Illinois Application January 18, 1954, Serial No. 404,603

2 Claims. (Cl. 179—171)

The present invention relates to amplifier circuits, and more particularly to an improved transistor amplifier which is constructed to have improved stability and increased high frequency response as compared with prior circuits of this general type.

As pointed out in an article by D. E. Thomas in the November 1952 edition of the "Proceedings of the Institute of Radio Engineers" at page 1481 and entitled, "Transistor Amplifier—Cutoff Frequency," the current gain cutoff frequency of a transistor in an amplifier is affected greatly by feedback in the amplifier. For example, in a common base junction transistor amplifier, as well as in a common-emitter junction transistor amplifier, the base resistance of the transistor normally produces positive feedback at the lower signal frequencies. However, this feedback decreases and shifts in phase for the higher signal frequencies. This gives rise to a condition of instability and limited band width response at the lower signal frequencies, and also reduces the effective current gain cutoff frequency of the transistor by an appreciable amount for the higher signal frequencies. It is, therefore, most desirable to neutralize this feedback in the transistor amplifier so as to improve its stability and increase the current gain cutoff frequency of the transistor.

It is, accordingly, a general object of the present invention to provide an improved transistor amplifier which is constructed to exhibit improved stability and an increased effective current gain cutoff frequency as compared with prior amplifiers of this general type.

A feature of the invention is the provision of circuit means in a transistor amplifier for neutralizing the effect of feedback due to the base resistance of the transistor, the circuit means responding to the feedback to establish the emitter electrode of the transistor at the potential of the internal node thereof insofar as the effects of feedback are concerned to reduce the emitter current due to feedback to a null.

The invention will be described in conjunction with the common-base type of transistor amplifier. However, it will be evident to those skilled in the art that the neutralizing circuit to be disclosed can also be used in a common-emitter transistor amplifier to neutralize the effect of feedback due to base resistance on the emitter current of the transistor therein.

Figure 1:
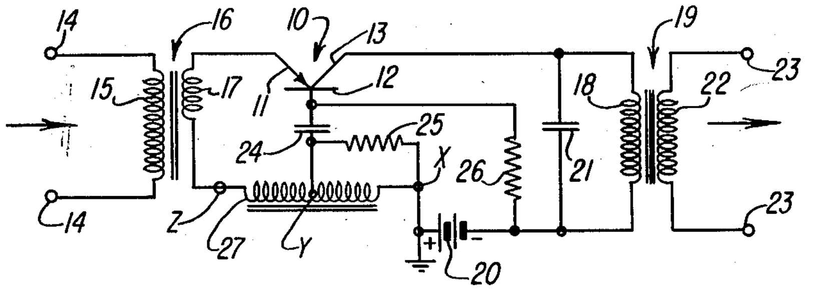
Figure 2:
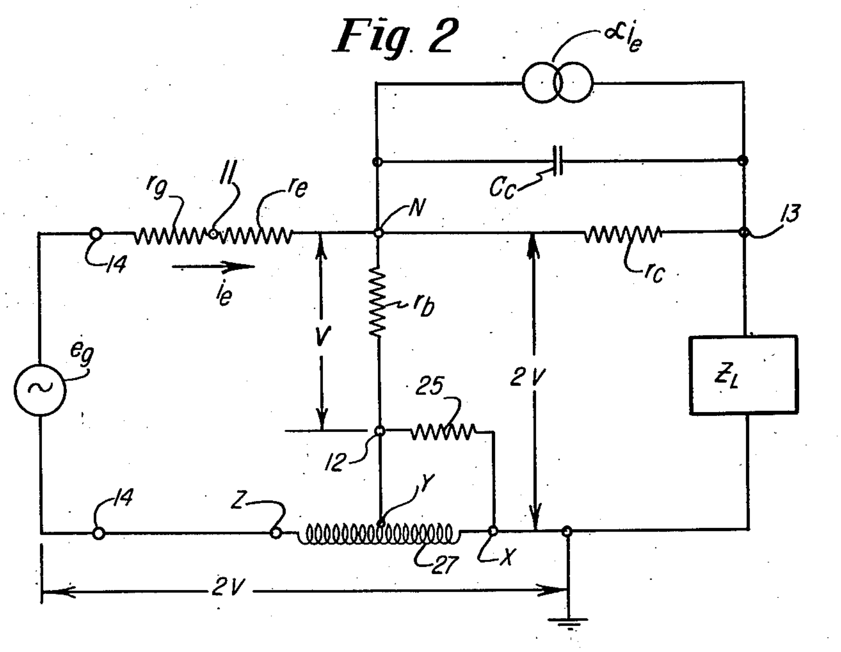

The above and other features of the invention which are believed to be new are set forth with particularity in the appended claims. The invention itself, however, together with further objects and advantages thereof may best be understood by reference to the following description when taken in conjunction with the accompanying drawing in which:

Fig. 1 shows a common-base transistor amplifier circuit constructed in accordance with the present invention, and Fig. 2 shows the equivalent circuit of the amplifier of Fig. 1.

The invention provides a transistor amplifier which comprises a transistor having a base electrode, an emitter electrode and a collector electrode. The transistor exhibits respective resistance values between each of these electrodes and an internal node point within the transistor. The amplifier includes input and output circuits, and tends to develop feedback currents in the resistance between the base electrode and the internal node. These feedback currents tend to establish the internal node of the transistor at an alternating current potential with respect to a reference potential point. An impedance element is provided coupling the base electrode to the reference potential point, and neutralizing means is coupled across the impedance element and is connected to the emitter electrode. The neutralizing means responds to the voltage across the impedance element due to the feedback currents to establish the emitter electrode at an alternating current potential with respect to the reference point that is substantially equal to the potential of the node. This reduces the emitter current due to feedback to essentially zero and obviates the effects of feedback on the transistor.

The amplifier circuit shown in Fig. 1 includes a transistor unit 10 having an emitter electrode 11, a base electrode 12 and a collector electrode 13. The transistor amplifier also includes a pair of input terminals 14 which are connected respectively to the ends of a primary winding 15 of a coupling transformer 16. Transformer 16 is included in the input circuit of the transistor amplifier and has a secondary winding 17 having one end directly connected to the emitter electrode 11 of transistor 10.

The collector electrode 13 of the transistor is coupled through the primary winding 18 of a transformer 19 to the negative terminal of a source of unidirectional biasing potential 20, the positive terminal of the source being connected to a reference point or ground. Winding 18 is shunted by a capacitor 21 which tunes this winding to the carrier frequency of, for example, an intermediate frequency signal translated by the amplifier. Transformer 19 has a secondary winding 22 connected to a pair of output terminals 23 of the amplifier.

The base electrode 12 of transistor 10 is coupled to the reference point or ground through a blocking capacitor 24 and series-connected impedance element 25, shown as a resistor. Negative bias from source 20 is provided to the common electrode 12 by resistor 26 shunting elements 24 and 25. In this manner, source 20 provides appropriate bias to the electrodes of the transistor to enable the transistor properly to perform its amplifying function.

For neutralization purposes, an inductance winding 27 is provided which functions as an autotransformer. The primary winding of the transformer, which may be defined as that portion of winding 27 between the end X of the winding and an intermediate tap Y, is connected across impedance element 25, the point X being connected to the reference point or ground. The other end Z of inductance winding 27 is connected to the other end of secondary winding 17 of transformer 16. In this manner, the secondary winding of the transformer (which may be defined as that portion of coil 27 between points X and Z) is connected between winding 17 of transformer 16 and the reference point mentioned above. It is apparent, of course, that the auto transformer 27 can be replaced by a separate winding transformer if so desired. This latter arrangement has the advantage in that it allows both the input and output circuits to have a common ground terminal. This follows since the secondary can have one side connected to the emitter with the input signal applied between its other side and ground.

The operation of the amplifier may best be understood by reference to the equivalent circuit of Fig. 2. In the latter circuit, the signal source connected across terminals 14 is indicated as $e_g$ and has an internal resistance $r_g$. This source may, for example, be a first detector or intermediate frequency amplifier stage in a superheterodyne radio or television receiver. The transistor 10 has an internal node, represented by N, and the unit exhibits a resistance $r_e$ between the emitter electrode 11 and the node, a resistance $r_c$ between the collector electrode 13 and the node, and a resistance $r_b$ between the base electrode 12 and the node. The load impedance $Z_L$ couples the collector electrode to the reference or ground point, and the resistor 25 couples the base electrode to this point. The capacity between the collector electrode and the node is represented as $C_c$ in shunt with the resistance $r_c$.

The current flow through $r_c$ corresponds to the product of the emitter current ($i_e$) and the current gain amplification factor ($\alpha$) of the transistor. It is evident that should an equivalent current test generator ($\alpha i_e$), connected across $r_c$, produce a voltage between the emitter electrode and node point in the absence of an input signal, that feedback exists. The present invention provides a simple neutralizing circuit that is connected so that the voltage between the emitter electrode and the node point from the application of the equivalent current test generator is reduced to a null.

The current ($\alpha i_e$) from the equivalent current test generator produces a potential drop across the common base resistance $r_b$ and resistor 25, and this establishes the internal node N at an alternating current potential with respect to the reference point that may be termed 2V. Under these conditions, if the potential of the emitter electrode were at the potential of the reference point, an emitter current ($i_e$) due to feedback would flow through $r_e$. To obviate this, the neutralizing circuit of the present invention establishes the emitter electrode 11 at essentially the same potential as the potential of the node N produced by the equivalent current generator.

Resistance $r_b$ and resistor 25 form a potentiometer between node N and the reference point. Therefore, should the node be established at a potential 2V with respect to the reference point due to the equivalent current test generator ($\alpha i_e$), the base electrode 12 is established at a potential V with respect to the reference point if the resistor 25 equals the resistance $r_b$. A voltage V is, therefore, impressed across the primary winding of the autotransformer 27 and the transformer is designed so that a voltage 2V, equal to the voltage of node N, appears across its secondary winding. This latter voltage appears in series with the input circuit and has the proper phase to establish the emitter electrode 11 at the same potential as the internal node N. Therefore, both ends of resistance $r_e$ are established at the same potential with respect to the reference point so that essentially no current $i_e$ due to feedback flows in resistance $r_e$.

It is apparent that resistor 25 need not be equal to the resistance $r_b$ but may have any desired proportion with respect thereto, with the windings of the autotransformer of coil 27 being correspondingly proportioned to provide the desired potential at the input electrode 11.

In a constructed embodiment of the invention, the following circuit parameters were used and these parameters are listed herein merely by way of example and are not intended to limit the invention in any way.

| | |
|---|---|
| Coil **27** | 25 millihenries. |
| Capacitor **24** | 0.1 microfarads. |
| Resistor **25** | 56 kilo-ohms. |
| Resistor **26** | 250 ohms. |
| Capacitor **21** | 350 micromicrofarads. |
| Transistor **10** | Raytheon CK 721. |

When the circuit parameters listed above are used, a maximum gain of 29.7 decibels may be obtained, as compared with a gain of 30.4 decibels of an unneutralized grounded base amplifier.

The circuit of the invention was found to be efficiently neutralized, and exhibited increased frequency response and stability as a result of such neutralization.

The invention provides, therefore, an improved transistor amplifier that utilizes a relatively simple neutralizing network to improve the stability of the amplifier and to increase the effective current gain cutoff frequency of the transistor utilized in the amplifier with resulting increase in the high frequency response of the amplifier.

While a particular embodiment of the invention has been shown and described, modifications may be made, and it is intended in the appended claims to cover all such modifications as fall within the true spirit and scope of the invention.

I claim:

1. A transistor amplifier for amplifying an applied input signal including in combination, a transistor having a base electrode, an emitter electrode and a collector electrode, said transistor exhibiting base resistance between said base electrode and an internal node point; an output circuit coupled between said collector electrode and a point of reference potential; means including an impedance element coupling said base electrode to said reference potential point and acting in conjunction with said base resistance to establish said node of the transistor at an alternating-current potential with respect to said reference potential point due to feedback within the transistor from said collector electrode; a neutralizing transformer having a primary winding connected across said impedance element and having a secondary winding with one side connected to said reference potential point; and means coupling the other side of said secondary winding to said emitter electrode to apply an alternating-current potential to said emitter electrode, the magnitudes of said impedance element and said windings being so selected and proportioned with respect to the value of said base resistance that the alternating current potential developed across said secondary winding has a value with respect to said reference potential point essentially equal to said alternating-current potential of said node produced by feedback from said collector electrode to thereby reduce to a null the emitter current due to such feedback.

2. A transistor amplifier for amplifying an applied input signal including in combination, a transistor having a base electrode, an emitter electrode and a collector electrode, said transistor exhibiting base resistance between said base electrode and an internal node point; an input circuit having one side connected to said emitter electrode; an output circuit coupled between said collector electrode and a point of reference potential; means including a resistive element coupling said base electrode to said reference potential point and acting in conjunction with said base resistance to establish said node of the transistor at an alternating-current potential with respect to said reference potential point due to feedback from said collector electrode within the transistor; and an inductance winding having first and second end terminals and an intermediate tap, with said first end terminal being connected to said reference point, said intermediate tap being coupled to the side of said resistive element remote from said reference point, and said second end terminal of said inductance winding being connected to the other side of said input circuit to apply to said emitter electrode in addition to the input signal an alternating current potential, the magnitudes of said resistance element and said inductance winding and the position of said intermediate tap being so selected and proportioned that the alternating current potential at said second end terminal of said inductance winding with respect to said reference potential point is essentially equal to said alternating-current potential of said node produced by feedback from said collector electrode to thereby reduce to a null the emitter current due to such feedback.

References Cited in the file of this patent

UNITED STATES PATENTS

| | | |
|---|---|---|
| 2,644,859 | Barton | July 7, 1953 |
| 2,663,766 | Meacham | Dec. 22, 1953 |